US012628599B2

(12) United States Patent
Odanaka

(10) Patent No.: US 12,628,599 B2
(45) Date of Patent: May 12, 2026

(54) MANUFACTURING METHOD OF CHIPS

(71) Applicant: DISCO CORPORATION, Tokyo (JP)

(72) Inventor: Kentaro Odanaka, Tokyo (JP)

(73) Assignee: Deckers Outdoor Corporation, Goleta, CA (US)

( * ) Notice: Subject to any disclaimer, the term of this patent is extended or adjusted under 35 U.S.C. 154(b) by 350 days.

(21) Appl. No.: 18/299,786

(22) Filed: Apr. 13, 2023

(65) Prior Publication Data

US 2023/0369116 A1      Nov. 16, 2023

(30) Foreign Application Priority Data

May 10, 2022      (JP) .................................. 2022-077407

(51) Int. Cl.
　　H10P 54/00　　　　(2026.01)
　　H10P 50/00　　　　(2026.01)
　　H10P 50/24　　　　(2026.01)
(52) U.S. Cl.
　　CPC ............ H10P 54/00 (2026.01); H10P 50/242 (2026.01); H10P 50/244 (2026.01); H10P 50/693 (2026.01)
(58) Field of Classification Search
　　CPC .................. H01L 21/78; H01L 21/3083; H01L 21/30655; H01L 21/3065; H01L 21/31116; H01L 21/56; H01L 21/76; B23K 26/38; H10P 54/00; H10P 50/244; H10P 50/693; H10P 50/242; H10P 50/283; H10W 10/00; H10W 10/01; H10W 74/01
　　See application file for complete search history.

(56) References Cited

U.S. PATENT DOCUMENTS

| | | | |
|---|---|---|---|
| 2012/0322234 A1 | 12/2012 | Yalamanchili et al. | |
| 2014/0141596 A1* | 5/2014 | Matsuzaki ............. | B23K 26/40 |
| | | | 438/462 |
| 2017/0133269 A1* | 5/2017 | Obata ................... | H01L 21/304 |
| 2020/0294791 A1 | 9/2020 | Okita et al. | |
| 2021/0398854 A1 | 12/2021 | Park et al. | |

FOREIGN PATENT DOCUMENTS

| | | |
|---|---|---|
| JP | 2016207737 A | 12/2016 |
| JP | 2020027889 A | 2/2020 |
| JP | 2020150166 A | 9/2020 |

OTHER PUBLICATIONS

Office Action issued in counterpart German patent application No. 10 2023 204 080.8, dated Nov. 4, 2024.
Japanese Patent Application No. 2022-077407: English translation of Office Action, Nov. 25, 2025 (3 pages).

* cited by examiner

*Primary Examiner* — Thanh T Nguyen
(74) *Attorney, Agent, or Firm* — Greer Burns & Crain, Ltd.

(57)      ABSTRACT
First penetrating paths that penetrate an insulating film are formed by irradiation with a laser beam along the boundaries of multiple devices from a surface side of the insulating film prior to formation of a mask used when a wafer is divided by plasma etching (protective film forming step and second laser beam irradiation step). In this case, the irradiation condition of the laser beam for removing the desired part of the insulating film and the irradiation condition of the laser beam for forming the mask, that is, for removing the desired part of a protective film, can each be set to a preferable condition. As a result, it becomes possible to improve the processing accuracy when the wafer is divided to manufacture chips.

4 Claims, 7 Drawing Sheets

FIG.2

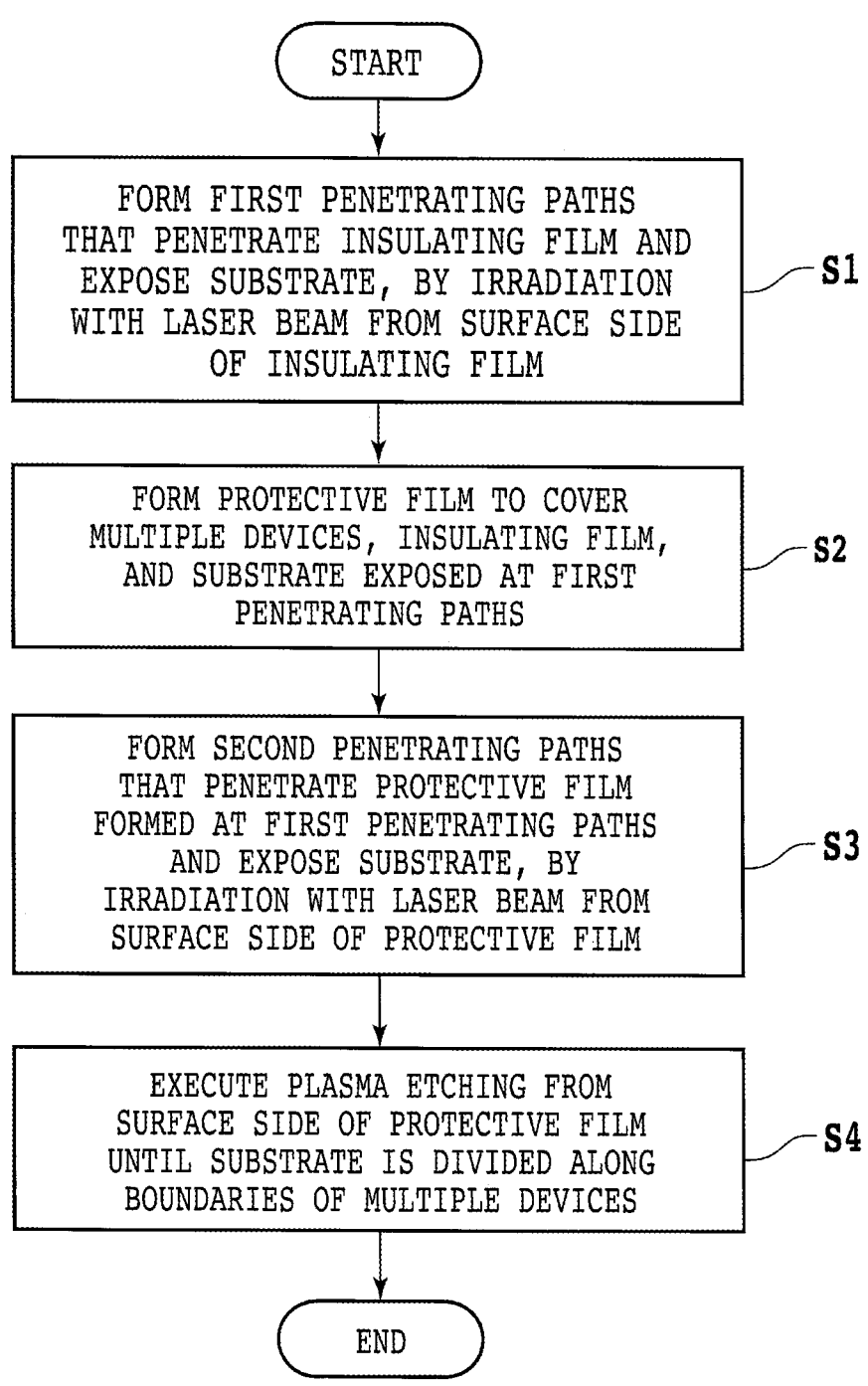

START

FORM FIRST PENETRATING PATHS
THAT PENETRATE INSULATING FILM AND
EXPOSE SUBSTRATE, BY IRRADIATION
WITH LASER BEAM FROM SURFACE SIDE
OF INSULATING FILM                                    S1

FORM PROTECTIVE FILM TO COVER
MULTIPLE DEVICES, INSULATING FILM,
AND SUBSTRATE EXPOSED AT FIRST
PENETRATING PATHS                                    S2

FORM SECOND PENETRATING PATHS
THAT PENETRATE PROTECTIVE FILM
FORMED AT FIRST PENETRATING PATHS
AND EXPOSE SUBSTRATE, BY
IRRADIATION WITH LASER BEAM FROM
SURFACE SIDE OF PROTECTIVE FILM                      S3

EXECUTE PLASMA ETCHING FROM
SURFACE SIDE OF PROTECTIVE FILM
UNTIL SUBSTRATE IS DIVIDED ALONG
BOUNDARIES OF MULTIPLE DEVICES                       S4

END

MANUFACTURING METHOD OF CHIPS

BACKGROUND OF THE INVENTION

Field of the Invention

The present invention relates to a manufacturing method of chips in which a wafer having a substrate and multiple devices disposed on the front surface side of the substrate with the interposition of an insulating film is divided along the boundaries of the multiple devices to manufacture the chips.

Description of the Related Art

Chips of a device such as an integrated circuit (IC) are constituent elements indispensable in various kinds of electronic equipment such as mobile phones and personal computers. Such chips are manufactured by dividing a wafer in which multiple devices are formed, along the boundaries of the multiple devices, for example.

As a method for dividing the wafer as above, there has been proposed a technique in which a mask is provided on the front surface of the wafer in such a manner that the boundaries are exposed and thereafter plasma etching is executed for this wafer (for example, refer to Japanese Patent Laid-open No. 2016-207737). For example, this mask is formed by covering the front surface of the wafer by a protective film containing a light absorbing agent and then executing irradiation with a laser beam along the boundaries from the surface side of the protective film to remove part of the protective film.

SUMMARY OF THE INVENTION

For the purpose of enhancement in the quality of chips, the chips are manufactured from a wafer having a substrate composed of a semiconductor and multiple devices disposed on the front surface side of the substrate with the interposition of a film composed of an insulator (insulating film), what is generally called a silicon-on-insulator (SOI) wafer, in some cases. Further, this SOI wafer is sometimes divided by plasma etching as described above.

In this case, part of the insulating film is frequently removed together with part of the protective film provided on the front surface of the wafer by the laser beam with which irradiation is executed for forming the mask for plasma etching. Typically, this part of the insulating film is not directly removed by the irradiation with the laser beam.

Specifically, because the insulator has high band-gap energy, this laser beam is typically transmitted through the insulating film. On the other hand, the laser beam that has transmitted through the insulating film is absorbed by the semiconductor that configures the substrate. In this case, laser ablation occurs in the vicinity of the front surface of the substrate. Moreover, part of the insulating film located at the boundaries of the multiple devices evaporates to be removed in association with this laser ablation.

However, when the insulating film is thick and/or when the laser ablation occurs in a broad range in the front surface of the substrate, there is a possibility that it becomes difficult to remove the desired part of the insulating film or a broad part of the insulating film is removed, that is, film separation occurs.

In view of this point, an object of the present invention is to provide a manufacturing method of chips that can improve the processing accuracy when a wafer having a substrate and multiple devices disposed on the front surface side of the substrate with the interposition of an insulating film is divided by plasma etching to manufacture the chips.

In accordance with an aspect of the present invention, there is provided a manufacturing method of chips in which a wafer having a substrate and multiple devices disposed on a front surface side of the substrate with the interposition of an insulating film is divided along boundaries of the multiple devices to manufacture the chips. The manufacturing method includes a first laser beam irradiation step of forming first penetrating paths that penetrate the insulating film and expose the substrate, by executing irradiation with a laser beam along the boundaries from a surface side of the insulating film under a first irradiation condition, and a protective film forming step of forming a protective film to cover the multiple devices, the insulating film, and the substrate exposed at the first penetrating paths, after the first laser beam irradiation step. The manufacturing method includes also a second laser beam irradiation step of forming second penetrating paths that penetrate the protective film formed at the first penetrating paths and expose the substrate, by executing irradiation with the laser beam along the boundaries from a surface side of the protective film under a second irradiation condition different from the first irradiation condition, after the protective film forming step, and a dividing step of executing plasma etching from the surface side of the protective film until the substrate is divided along the boundaries, after the second laser beam irradiation step.

Preferably, the insulating film is composed of a material through which the laser beam transmits.

In the present invention, the first penetrating paths that penetrate the insulating film are formed by irradiation with the laser beam along the boundaries of the multiple devices from the surface side of the insulating film, prior to formation of a mask used when the wafer is divided by the plasma etching (protective film forming step and second laser beam irradiation step). That is, in the present invention, part of the insulating film located at the boundaries of the multiple devices is removed prior to the formation of the mask.

In this case, the irradiation condition of the laser beam for removing the desired part of the insulating film and the irradiation condition of the laser beam for forming the mask, that is, for removing the desired part of the protective film, can each be set to a preferable condition. As a result, in the present invention, it becomes possible to improve the processing accuracy when the wafer is divided to manufacture the chips.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a flowchart schematically illustrating one example of a manufacturing method of chips in which the wafer is divided along the boundaries of multiple devices to manufacture the chips;

DETAILED DESCRIPTION OF THE PREFERRED EMBODIMENT

Figure 1A:
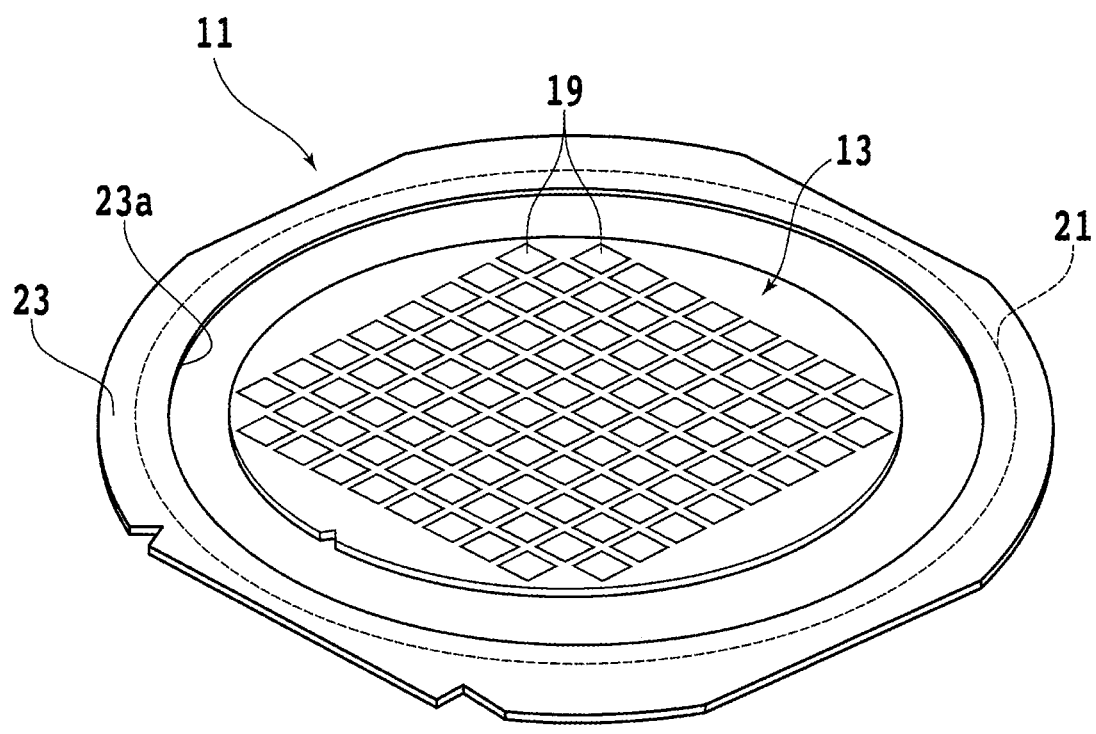
FIG. 1A is a perspective view schematically illustrating one example of a frame unit including a wafer.
Figure 1B:
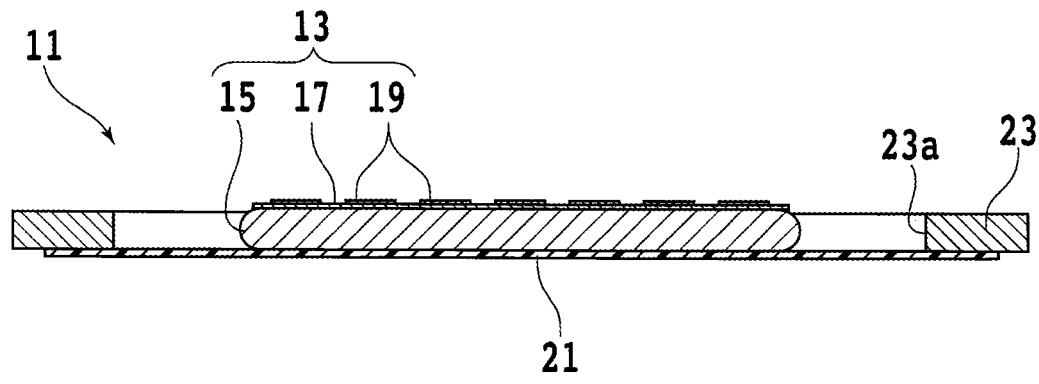
FIG. 1B is a sectional view schematically illustrating a section of the frame unit illustrated in FIG. 1A.

An embodiment of the present invention will be described with reference to the accompanying drawings. FIG. 1A is a perspective view schematically illustrating one example of a frame unit including a wafer. FIG. 1B is a sectional view schematically illustrating a section of the frame unit illustrated in FIG. 1A. A frame unit 11 illustrated in FIG. 1A and FIG. 1B includes a wafer 13 used for manufacturing chips.

The wafer 13 has a substrate 15 composed of a semiconductor such as silicon (Si), for example. On a front surface of the substrate 15, an insulating film 17 composed of an insulator such as silicon oxide ($SiO_2$) or silicon nitride ($Si_3N_4$), for example, is disposed. The thickness of the insulating film 17 is 5 to 30 μm, for example.

Further, multiple devices 19 independent of each other are disposed on a front surface side of the wafer 13. That is, the multiple devices 19 are disposed on a front surface side of the substrate 15 with the interposition of the insulating film 17. In addition, the multiple devices 19 are arranged in a matrix manner on a surface of the insulating film 17. That is, the boundaries of the multiple devices 19 extend in a lattice manner.

Further, a central region of a circular plate-shaped tape 21 with a longer diameter than the substrate 15 is stuck to a back surface of the wafer 13, that is, a back surface of the substrate 15. For example, the tape 21 has a film-shaped base layer having flexibility and an adhesive layer (glue layer) disposed on one surface of the base layer (surface on the side of the substrate 15).

Specifically, the base layer is composed of polyolefin (PO), polypropylene (PP), polyethylene terephthalate (PET), polyvinyl chloride (PVC), polystyrene (PS), or the like. Further, the adhesive layer is an ultraviolet-curable silicone rubber, an acrylic-based material, an epoxy-based material, or the like.

Moreover, an annular frame 23 in which a circular opening 23*a* with a longer diameter than the wafer 13 is formed is stuck to an outer circumferential region of the tape 21. The frame 23 is composed of metal such as aluminum (Al), for example.

FIG. 2 is a flowchart schematically illustrating one example of a manufacturing method of chips in which the wafer 13 is divided along the boundaries of the multiple devices 19 to manufacture the chips. In this method, first, first penetrating paths that penetrate the insulating film 17 and expose the substrate 15 are formed by irradiation with a laser beam from a surface side of the insulating film 17 (first laser beam irradiation step: S1).

Figure 3A:
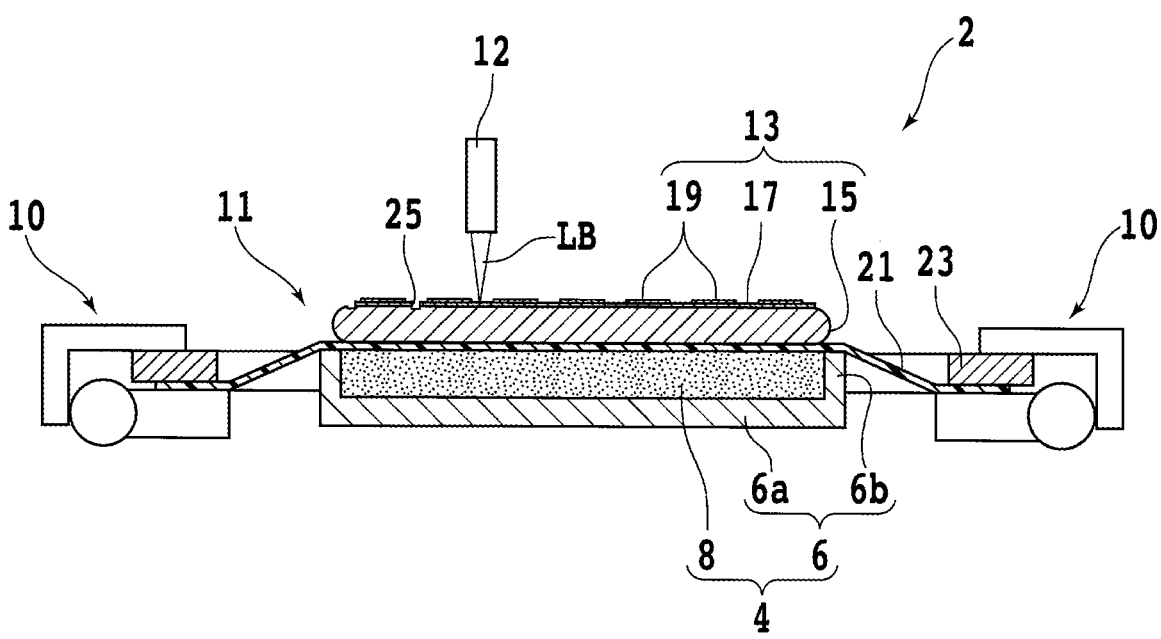
FIG. 3A is a partially sectional side view schematically illustrating the state of a first laser beam irradiation step.
Figure 3B:
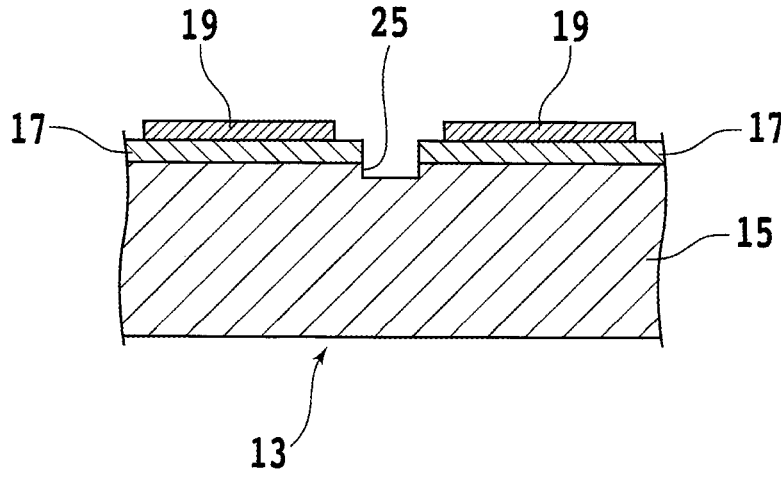
FIG. 3B is a partially enlarged sectional view schematically illustrating the wafer obtained after the first laser beam irradiation step.

FIG. 3A is a partially sectional side view schematically illustrating the state of the first laser beam irradiation step (S1). FIG. 3B is a partially enlarged sectional view schematically illustrating the wafer 13 obtained after the first laser beam irradiation step (S1). The first laser beam irradiation step (S1) is executed with use of a laser processing apparatus 2 illustrated in FIG. 3A, for example.

The laser processing apparatus 2 has a holding table 4. The holding table 4 has a circular plate-shaped frame body 6 composed of ceramic or the like. The frame body 6 has a bottom wall 6*a* with a circular plate shape and a circular cylindrical sidewall 6*b* erected from an outer edge part of the bottom wall 6*a*. That is, a circular plate-shaped recessed part defined by the bottom wall 6*a* and the sidewall 6*b* is formed on an upper surface side of the frame body 6.

Moreover, to the recessed part formed on the upper surface side of the frame body 6, a circular plate-shaped porous plate 8 having a diameter substantially equal to the diameter of the recessed part is fixed. The porous plate 8 is composed of porous ceramic, for example. Further, when the frame unit 11 is carried in to the laser processing apparatus 2, the wafer 13 is placed over an upper surface of the holding table 4 with the interposition of the tape 21.

In addition, multiple clamps 10 are disposed around the holding table 4. The multiple clamps 10 are disposed at substantially equal intervals along a circumferential direction of the holding table 4. Further, when the frame unit 11 is carried in to the laser processing apparatus 2, the multiple clamps 10 hold the frame 23 at a position lower than the upper surface of the holding table 4.

Moreover, the porous plate 8 of the holding table 4 communicates with a suction source (not illustrated) such as an ejector through a through-hole formed in the bottom wall 6*a* of the frame body 6. Further, when the suction source is operated in a state in which the frame unit 11 has been carried in to the laser processing apparatus 2, a suction force acts on the wafer 13 with the interposition of the tape 21, and the wafer 13 is held by the holding table 4.

Further, the holding table 4 and the multiple clamps 10 are coupled to a horizontal direction movement mechanism (not illustrated). The horizontal direction movement mechanism has a ball screw, a motor, and so forth, for example. In addition, when the horizontal direction movement mechanism is operated, the holding table 4 and the multiple clamps 10 move along the horizontal direction (for example, front-rear direction and/or left-right direction).

Moreover, a head 12 of a laser irradiation unit is disposed over the holding table 4. The laser irradiation unit has a laser oscillator (not illustrated) that generates a pulsed laser beam LB with such a wavelength (for example, 355 nm) as to be transmitted through the insulating film 17 and be absorbed by the substrate 15. For example, this laser oscillator has neodymium doped yttrium aluminum garnet (Nd:YAG) or the like as a laser medium.

Further, the head 12 houses an optical system including collecting lens, mirrors, and so forth. Moreover, when the laser beam LB is generated by the laser oscillator, the laser beam LB is emitted toward the holding table 4 through the optical system housed in the head 12.

In addition, the head 12 is coupled to a vertical direction movement mechanism (not illustrated). The vertical direction movement mechanism has a ball screw, a motor, and so forth, for example. Further, when the vertical direction movement mechanism is operated, the head 12 moves along the vertical direction.

Moreover, in the first laser beam irradiation step (S1), irradiation with the laser beam LB is executed along the boundaries of the multiple devices 19 in a state in which the wafer 13 is held by the holding table 4 with the interposition of the tape 21.

Specifically, while the focal point of the laser beam LB emitted from the head 12 toward the wafer 13 is positioned to the vicinity of the front surface of the substrate 15, the holding table 4 is moved to cause the wafer 13 to be irradiated with the laser beam LB along the boundaries of the multiple devices 19 (see FIG. 3A).

Here, in the first laser beam irradiation step (S1), the irradiation condition of the laser beam LB is set to a condition suitable to remove the desired part of the insulating film 17. Specifically, the laser beam LB at this time is set to cause the power to become, for example, 3 to 5 W, typically 4 W, and cause the frequency to become, for example, 1500 to 2500 kHz, typically 2000 kHz.

Moreover, the laser beam LB is set to form a focal point with a circular shape in plan view and cause the diameter of this focal point to become, for example, 8 µm or smaller, preferably 6 µm or smaller. Furthermore, the movement speed of the holding table 4 at this time is set to, for example, 300 to 500 mm/s, typically 400 mm/s.

Owing to this, the laser beam LB transmits through the insulating film 17 and is absorbed by the substrate 15, and laser ablation occurs in the vicinity of the front surface of the substrate 15. Further, part of the insulating film 17 located at the boundaries of the multiple devices 19 evaporates to be removed in association with this laser ablation. As a result, first penetrating paths 25 that penetrate the insulating film 17 and expose the front surface of the substrate 15 are formed in the wafer 13 (see FIG. 3B).

Figure 4A:
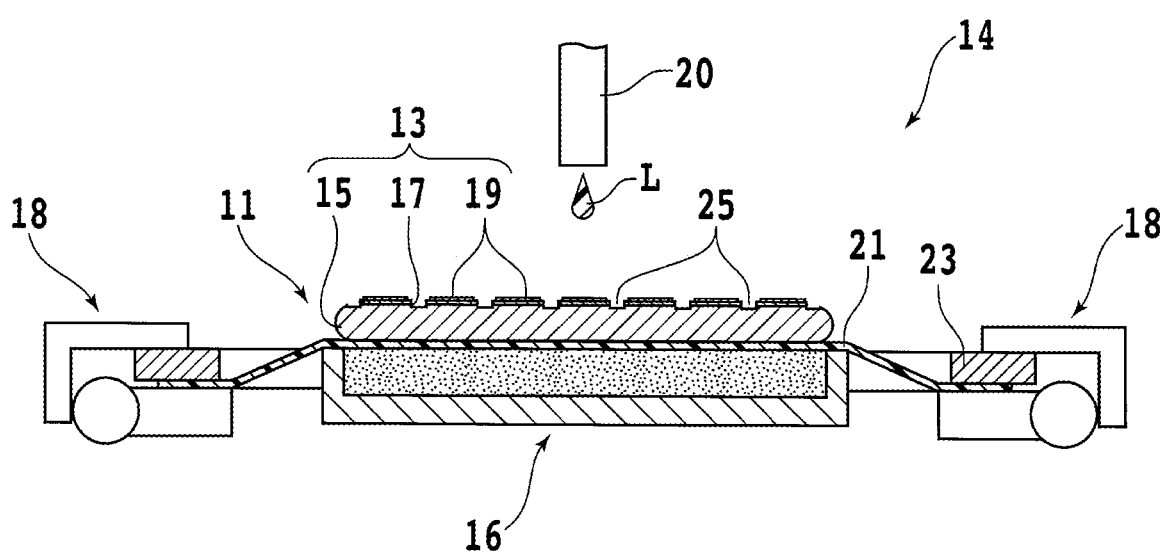
FIG. 4A is a partially sectional side view schematically illustrating the state of a protective film forming step.
Figure 4B:
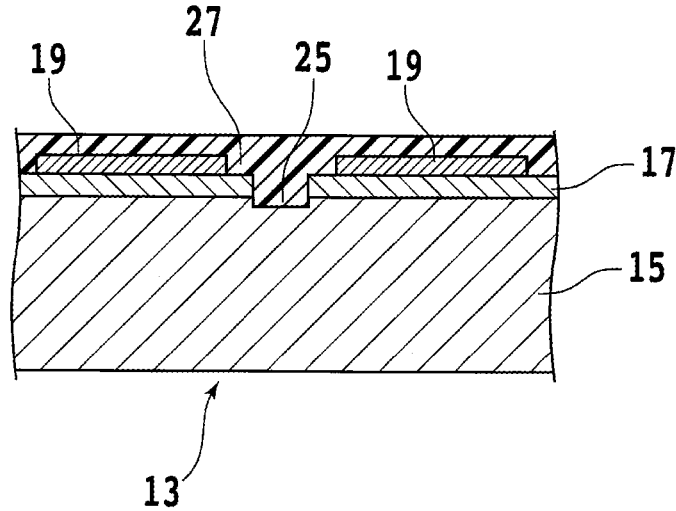
FIG. 4B is a partially enlarged sectional view schematically illustrating the wafer obtained after the protective film forming step.

After the first laser beam irradiation step (S1), a protective film is formed to cover the multiple devices 19, the insulating film 17, and the substrate 15 exposed at the first penetrating paths 25 (protective film forming step: S2). FIG. 4A is a partially sectional side view schematically illustrating the state of the protective film forming step (S2). FIG. 4B is a partially enlarged sectional view schematically illustrating the wafer 13 obtained after the protective film forming step (S2).

The protective film forming step (S2) is executed with use of an applying apparatus 14 illustrated in FIG. 4A, for example. The applying apparatus 14 has a holding table 16 having a structure similar to that of the above-described holding table 4 and multiple clamps 18 having a structure similar to that of the above-described multiple clamps 10. Moreover, the holding table 16 communicates with a suction source (not illustrated) such as an ejector similarly to the above-described holding table 4.

Further, the holding table 16 and the multiple clamps 18 are coupled to a rotation mechanism (not illustrated). This rotation mechanism has a pulley, a motor, and so forth, for example. Further, when this rotation mechanism is operated, the holding table 16 and the multiple clamps 18 rotate with the rotation axis being a straight line that passes through the center of an upper surface of the holding table 16 and extends along the vertical direction.

Further, a resin supply nozzle 20 that supplies a liquid resin L to the front surface of the wafer 13 included in the frame unit 11 held by the holding table 16 is disposed over the holding table 16. For example, this liquid resin L is a solution containing a water-soluble resin such as polyvinylpyrrolidone or polyvinyl alcohol and an organic solvent such as propylene glycol monomethyl ether.

The water-soluble resin is the main component of the protective film formed by drying of the liquid resin L. Moreover, the organic solvent lowers the surface tension of the liquid resin L and reduces application unevenness that occurs when the liquid resin L is applied onto the wafer 13. In addition, a light absorbing agent such as ferulic acid may be added to the liquid resin L. This light absorbing agent absorbs the above-described laser beam LB and causes laser ablation in the protective film.

Further, in the protective film forming step (S2), the protective film is formed on the front surface of the wafer 13 held by the holding table 16 with the interposition of the tape 21, by what is generally called a spin coating method. Specifically, a predetermined amount of liquid resin L is supplied from the resin supply nozzle 20 to the vicinity of the center of the front surface of the wafer 13 (see FIG. 4A). Then, the holding table 16 is rotated at a predetermined speed (for example, at least 1500 rpm and at most 3000 rpm).

As a result, the liquid resin L is applied onto the whole of the front surface of the wafer 13. Specifically, the liquid resin L is applied to cover the multiple devices 19, the insulating film 17, and the substrate 15 exposed at the first penetrating paths 25. Then, the liquid resin L is dried after the rotation of the holding table 16 is stopped. As a result, a water-soluble protective film 27 that coats the front surface of the wafer 13 is formed (see FIG. 4B).

Figure 5:
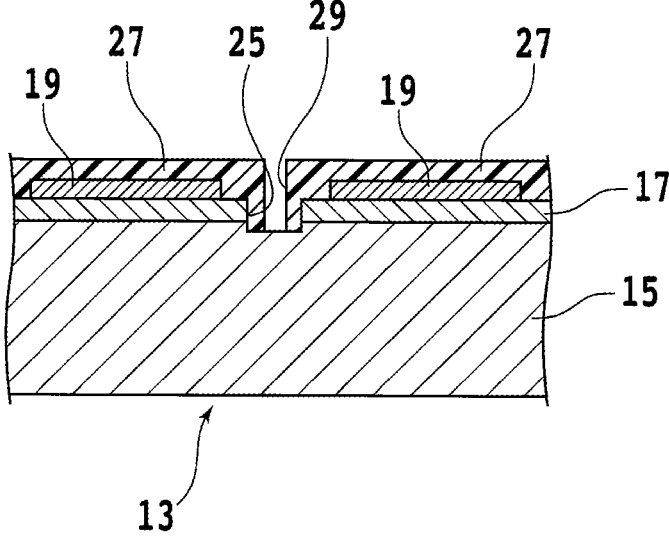
FIG. 5 is a partially enlarged sectional view schematically illustrating the wafer obtained after a second laser beam irradiation step.

After the protective film forming step (S2), second penetrating paths that penetrate the protective film 27 formed at the first penetrating paths 25 and expose the substrate 15 are formed by irradiation with the laser beam LB from a surface side of the protective film 27 (second laser beam irradiation step: S3). FIG. 5 is a partially enlarged sectional view schematically illustrating the wafer 13 obtained after the second laser beam irradiation step (S3).

The second laser beam irradiation step (S3) is executed with use of the laser processing apparatus 2 illustrated in FIG. 3A, for example. Further, in the second laser beam irradiation step (S3), irradiation with the laser beam LB is executed along the boundaries of the multiple devices 19 in a state in which the wafer 13 is held by the holding table 4 with the interposition of the tape 21.

Specifically, while the focal point of the laser beam LB emitted from the head 12 toward the wafer 13 is positioned to the vicinity of the front surface of the substrate 15, the holding table 4 is moved to cause the wafer 13 to be irradiated with the laser beam LB along the boundaries of the multiple devices 19.

Here, in the second laser beam irradiation step (S3), the irradiation condition of the laser beam LB is set to a condition suitable to remove the desired part of the protective film 27. Specifically, the laser beam LB at this time is set to cause the power to become, for example, 0.5 to 3 W, typically 1 W, and cause the frequency to become, for example, 100 to 1500 kHz, typically 500 kHz.

Moreover, the laser beam LB is set to form a focal point with a circular shape in plan view and cause the diameter of this focal point to become, for example, 8 µm or smaller, preferably 6 µm or smaller. Further, the movement speed of the holding table 4 at this time is set to, for example, 100 to 300 mm/s, typically 200 mm/s.

Owing to this, for example, the laser beam LB is absorbed by the light absorbing agent contained in the protective film 27, and laser ablation occurs in the protective film 27. As a result, second penetrating paths 29 that penetrate the protective film 27 formed at the first penetrating paths 25 and expose the substrate 15 are formed in the wafer 13 (see FIG. 5).

Figure 6:
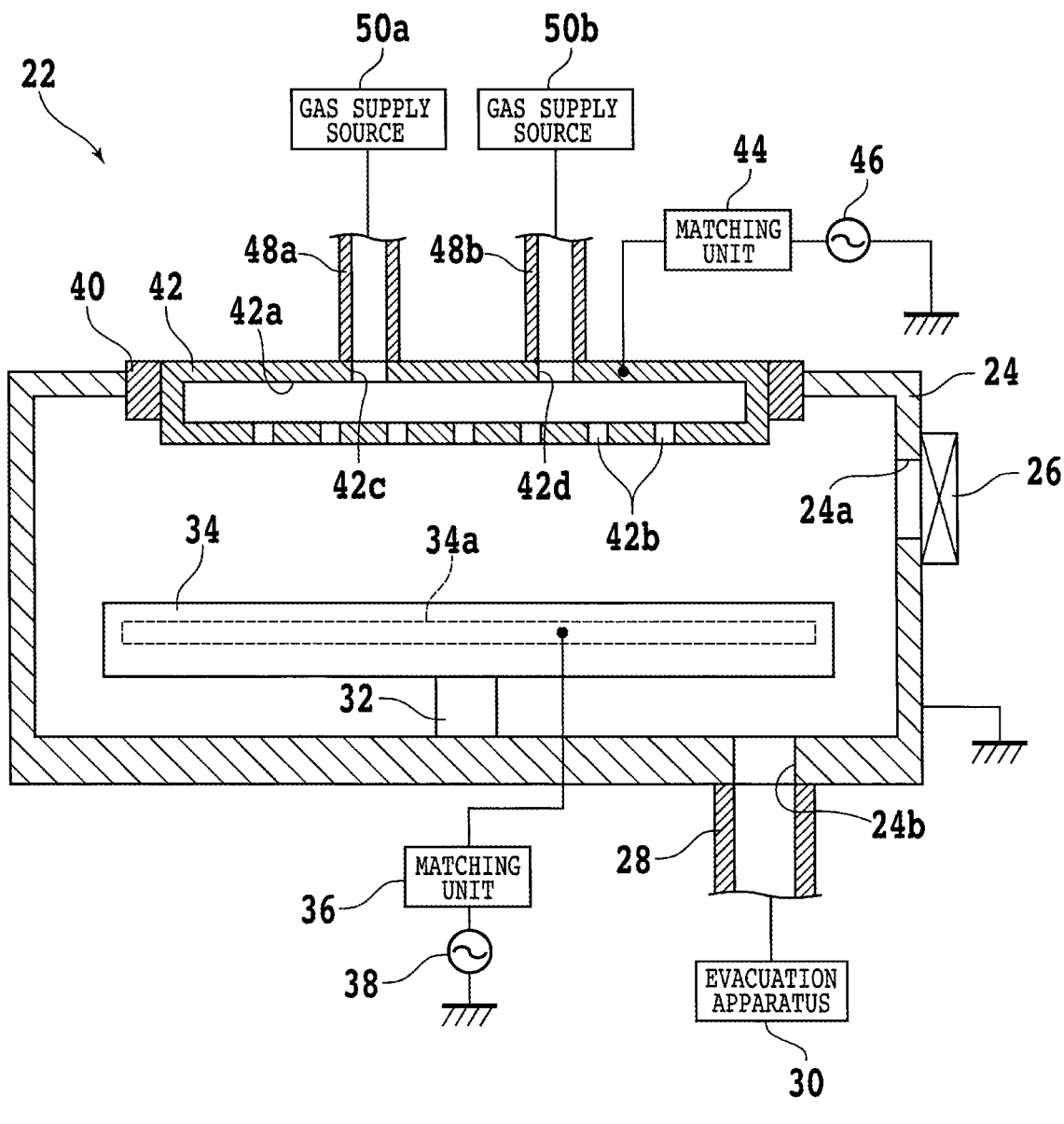
FIG. 6 is a diagram schematically illustrating one example of a plasma generating apparatus used to execute a dividing step.

After the second laser beam irradiation step (S3), plasma etching is executed from the surface side of the protective film 27 until the substrate 15 is divided along the boundaries of the multiple devices 19 (dividing step: S4). FIG. 6 is a diagram schematically illustrating one example of a plasma generating apparatus used to execute the dividing step (S4).

A plasma generating apparatus 22 illustrated in FIG. 6 has a chamber 24 that is composed of an electrically-conductive material and is grounded. In the chamber 24, a carrying-in/out port 24*a* for carrying in the frame unit 11 to the inside of the chamber 24 and carrying out the frame unit 11 from the inside of the chamber 24 is formed.

For the carrying-in/out port 24*a*, a gate valve 26 that can cause an internal space and an external space of the chamber 24 to be interrupted from or communicate with each other is disposed. Furthermore, an evacuation port 24*b* for evacuating the internal space of the chamber 24 is formed in the chamber 24.

The evacuation port 24*b* communicates with an evacuation apparatus 30 such as a vacuum pump through a pipe 28 and so forth. Moreover, a support member 32 is disposed on an inner surface of the chamber 24, and the support member 32 supports a table 34.

Further, an electrostatic chuck (not illustrated) is disposed at an upper part of the table 34. In addition, a circular plate-shaped electrode 34*a* located under the electrostatic chuck is disposed inside the table 34. The electrode 34*a* is connected to a high-frequency power supply 38 through a matching unit 36.

Moreover, an opening with a circular plate shape is formed at a position opposed to an upper surface of the table 34 in the chamber 24, and a gas ejection head 42 supported by the chamber 24 with the interposition of a bearing 40 is disposed in this opening. The gas ejection head 42 is composed of an electrically-conductive material and is connected to a high-frequency power supply 46 through a matching unit 44.

Further, a cavity (gas diffusion space) 42*a* is formed inside the gas ejection head 42. Moreover, multiple gas discharge ports 42*b* that cause the gas diffusion space 42*a* to communicate with the internal space of the chamber 24 are formed at a part inside the gas ejection head 42 (for example, lower part). Further, two gas supply ports 42*c* and 42*d* for supplying predetermined gas to the gas diffusion space 42*a* are formed at a part outside the gas ejection head 42 (for example, upper part).

Moreover, the gas supply port 42*c* communicates with a gas supply source 50*a* that supplies, for example, a carbon fluoride-based gas such as octafluorocyclobutane ($C_4F_8$) and/or a sulfur fluoride-based gas such as sulfur hexafluoride ($SF_6$) through a pipe 48*a* and so forth. In addition, the gas supply port 42*d* communicates with a gas supply source 50*b* that supplies, for example, an inert gas such as an argon (Ar) gas, an oxygen ($O_2$) gas, and so forth through the pipe 48*a* and so forth.

Further, in the dividing step (S4), the substrate 15 is divided along the boundaries of the multiple devices 19 by what is generally called the Bosch process, for example. Specifically, first, the frame unit 11 is carried in onto the table 34 with the tape 21 on the lower side in the state in which the gate valve 26 causes the internal space and the external space of the chamber 24 to communicate with each other.

Subsequently, the wafer 13 is held by the electrostatic chuck of the table 34 with the interposition of the tape 21. Next, the internal space of the chamber 24 is evacuated by the evacuation apparatus 30 to set the internal space to a vacuum state. Subsequently, isotropic plasma etching, formation of a protective film, and anisotropic plasma etching are repeatedly executed until the substrate 15 is divided along the boundaries of the multiple devices 19.

Specifically, this isotropic plasma etching is executed by high-frequency power being provided from the high-frequency power supply 46 to the gas ejection head 42 in the state in which gas containing $SF_6$ is supplied from the gas supply source 50*a* to the internal space of the chamber 24 and an Ar gas is supplied from the gas supply source 50*b*, for example. This causes isotropic etching of the substrate 15 exposed at the second penetrating paths 29 by F-based radicals and so forth generated in the internal space of the chamber 24.

Further, this formation of the protective film is executed by high-frequency power being provided from the high-frequency power supply 46 to the gas ejection head 42 in the state in which gas containing $C_4F_8$ is supplied from the gas supply source 50*a* to the internal space of the chamber 24 and gas containing Ar is supplied from the gas supply source 50*b*, for example. This causes deposition of CF radials on the front surface of the substrate 15 exposed at the second penetrating paths 29, and a film containing carbon fluoride is formed.

Alternatively, this formation of the protective film is executed by high-frequency power being provided from the high-frequency power supply 46 to the gas ejection head 42 in the state in which a gas containing $O_2$ and Ar is supplied from the gas supply source 50*b* to the internal space of the chamber 24. This causes reaction of the material (for example, Si) that configures the substrate 15 exposed at the second penetrating paths 29 with oxygen ions, and an oxide film is formed on the surface of the substrate 15.

Moreover, this anisotropic plasma etching is executed by high-frequency power being provided from the high-frequency power supply 38 to the electrode 34*a* disposed inside the table 34 and high-frequency power being provided from the high-frequency power supply 46 to the gas ejection head 42 in the state in which gas containing $SF_6$ is supplied from the gas supply source 50*a* to the internal space of the chamber 24 and an Ar gas is supplied from the gas supply source 50*b*, for example. This causes anisotropic etching of the substrate 15 through acceleration of F-based ions and so forth generated in the internal space of the chamber 24 toward the table 34.

Figure 7:
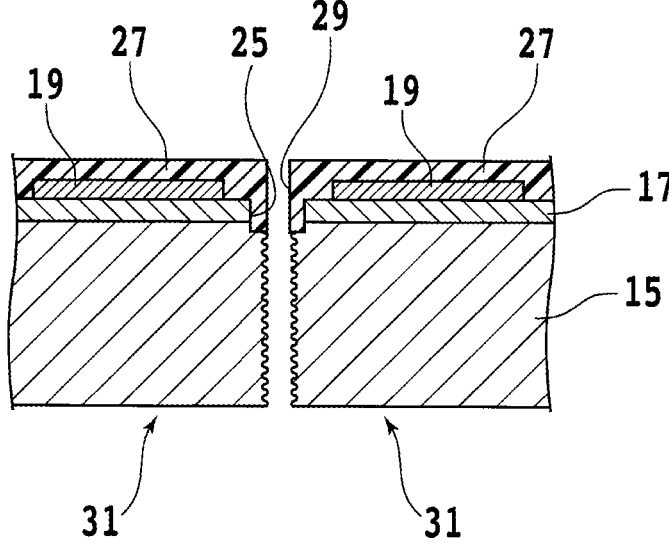
FIG. 7 is a partially enlarged sectional view schematically illustrating one example of the chips manufactured from the wafer divided in the dividing step.

FIG. 7 is a partially enlarged sectional view schematically illustrating one example of the chips manufactured from the wafer 13 divided in the dividing step (S4). When the substrate 15 is divided along the boundaries of the multiple devices 19 by the Bosch process, chips 31 in which side surfaces have a recessed-projecting shape are manufactured from the wafer 13 as illustrated in FIG. 7.

In the method illustrated in FIG. 2, the first penetrating paths 25 that penetrate the insulating film 17 are formed by irradiation with the laser beam LB along the boundaries of the multiple devices 19 from the surface side of the insulating film 17, prior to formation of the mask used when the wafer 13 is divided by the plasma etching (protective film forming step (S2) and second laser beam irradiation step (S3)). That is, in the method illustrated in FIG. 2, part of the insulating film 17 located at the boundaries of the multiple devices 19 is removed prior to the formation of the mask.

In this case, the irradiation condition of the laser beam LB for removing the desired part of the insulating film 17 and the irradiation condition of the laser beam LB for forming the mask, that is, for removing the desired part of the protective film 27, can each be set to a preferable condition. As a result, in the method illustrated in FIG. 2, it becomes possible to improve the processing accuracy when the wafer 13 is divided to manufacture the chips 31.

The above-described contents are one aspect of the present invention, and the contents of the present invention are not limited to the above-described contents. For example, in the above-described dividing step (S4), the substrate 15 may be divided along the boundaries of the multiple devices 19 by executing only the anisotropic plasma etching and not the isotropic plasma etching and the formation of the protective film.

Besides, structures, methods, and so forth according to the above-described embodiment can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of chips in which a wafer having a substrate and multiple devices disposed on a front surface side of the substrate with interposition of an insulating film is divided along boundaries of the multiple devices to manufacture the chips, the manufacturing method comprising:

a first laser beam irradiation step of forming first penetrating paths that penetrate the insulating film and expose the substrate, by executing irradiation with a laser beam along the boundaries from a front surface side of the insulating film under a first irradiation condition;

a protective film forming step of forming a single layer of a protective film to cover the multiple devices, the insulating film, and the substrate exposed at the first penetrating paths, after the first laser beam irradiation step;

a second laser beam irradiation step of forming second penetrating paths that penetrate the protective film formed at the first penetrating paths and expose the substrate while the protective film remains on and directly in contact with side surfaces of the multiple devices and the insulating film, and exposed side surfaces of the substrate formed by the first penetrating paths, by executing irradiation with the laser beam along the boundaries from a surface side of the protective film under a second irradiation condition different from the first irradiation condition, after the protective film forming step;

a dividing step of executing plasma etching from the surface side of the protective film until the substrate is divided along the boundaries, after the second laser beam irradiation step; and separating the wafer into the chips, after the dividing step, wherein each of the chips includes one of the devices, the insulating film, the substrate and the single layer of the protective film that covers the one of the devices, the insulating film and the substrate.

2. The manufacturing method of chips according to claim 1, wherein the insulating film is composed of a material through which the laser beam transmits.

3. The manufacturing method of chips according to claim 1, wherein the protective film forming step includes applying a liquid resin to a front surface of the wafer to form the single layer of the protective film.

4. The manufacturing method of chips according to claim 1, wherein the protective film is a water-soluble protective film.

* * * * *